United States Patent [19]

Boswell

[11] Patent Number: 5,464,690
[45] Date of Patent: Nov. 7, 1995

[54] HOLOGRAPHIC DOCUMENT AND METHOD FOR FORMING

[75] Inventor: David R. Boswell, Woodley, England

[73] Assignee: NovaVision, Inc., Bowling Green, Ohio

[21] Appl. No.: 222,283

[22] Filed: Apr. 4, 1994

[51] Int. Cl.⁶ .................................................. B32D 7/12
[52] U.S. Cl. ...................... 428/334; 428/35.3; 428/346; 428/349; 428/457; 428/458; 428/462; 428/464; 428/461; 428/484; 427/208.2; 427/404; 427/407.1; 427/148; 359/2; 264/1; 264/3; 283/86
[58] Field of Search ................ 428/35.3, 35.8, 428/35.9, 346, 349, 457, 458, 462, 464, 467, 461, 484, 334; 283/86; 359/2; 264/1, 3; 427/208.2, 404, 407.1, 148

[56] References Cited

U.S. PATENT DOCUMENTS

| | | | |
|---|---|---|---|
| 4,012,552 | 3/1977 | Watts | 428/200 |
| 4,225,211 | 9/1980 | Abe | 350/3.82 |
| 4,378,141 | 3/1983 | Yevick | 350/3.61 |
| 4,603,937 | 8/1986 | Copp | 350/368 |
| 4,631,222 | 12/1986 | Sander | 428/201 |
| 4,657,803 | 4/1987 | Pernicano | 428/200 |
| 4,717,615 | 1/1988 | Reinhart | 428/161 |
| 4,725,111 | 2/1988 | Weitzen et al. | 350/3 |
| 4,728,377 | 3/1988 | Gallagher | 156/58 |
| 4,758,296 | 7/1988 | McGrew | 156/231 |
| 4,759,969 | 7/1988 | Sander | 428/172 |
| 4,773,718 | 9/1988 | Weitzen et al. | 350/209 |
| 4,778,262 | 10/1988 | Haines | 350/3.66 |
| 4,832,445 | 5/1989 | Haines et al. | 350/162.2 |
| 4,837,072 | 6/1989 | Kraetschmer | 428/201 |
| 4,856,857 | 8/1989 | Takeuchi et al. | 350/3.6 |
| 4,877,710 | 10/1989 | Ishikawa | 430/138 |
| 4,892,602 | 1/1990 | Oike et al. | 156/233 |
| 4,893,887 | 1/1990 | Coates | 350/3.6 |
| 4,900,111 | 2/1990 | D'Amato et al. | 350/3.85 |
| 4,913,504 | 4/1990 | Gallagher | 350/3.6 |
| 4,913,858 | 4/1990 | Miekka et al. | 264/1.3 |
| 4,921,319 | 5/1990 | Mallik | 350/3.6 |
| 4,933,120 | 6/1990 | D'Amato et al. | 264/194 |
| 4,969,700 | 11/1990 | Haines | 350/3.66 |
| 4,971,646 | 11/1990 | Schell et al. | 156/244.17 |
| 4,976,799 | 12/1990 | Wood | 156/106 |
| 4,978,593 | 12/1990 | Yin et al. | 430/2 |
| 4,990,415 | 2/1991 | Yu | 430/2 |
| 5,003,915 | 4/1991 | D'Amato et al. | 118/46 |
| 5,013,494 | 5/1991 | Kubo et al. | 264/11.3 |
| 5,013,632 | 5/1991 | Weber | 430/281 |
| 5,044,707 | 9/1991 | Mallik | 359/2 |
| 5,053,260 | 10/1991 | Brehm | 428/40 |
| 5,063,658 | 11/1991 | Wild | 29/846 |
| 5,071,597 | 12/1991 | D'Amato et al. | 264/13 |
| 5,083,850 | 1/1992 | Mallik et al. | 359/1 |
| 5,085,514 | 2/1992 | Mallik et al. | 359/2 |
| 5,087,510 | 2/1992 | Tokas et al. | 428/209 |
| 5,116,548 | 5/1992 | Mallik et al. | 264/1.3 |
| 5,128,779 | 7/1992 | Mallik | 359/2 |
| 5,142,383 | 8/1992 | Mallik | 359/2 |
| 5,145,212 | 9/1992 | Mallik | 283/86 |

(List continued on next page.)

*Primary Examiner*—Edith Buffalow
*Attorney, Agent, or Firm*—Emch, Schaffer, Schaub & Procello

[57] ABSTRACT

A holographic article and method for forming permits the party producing the final document to print the holographic image directly on the final document thereby permitting such party to retain and maintain control of its own embossing shim on which the hologram has been formed and which is utilized for embossing the holographic image on the document. A film upon which a holographic image can be directly stamped upon the final document includes a layer of metal having a thickness in the range of 20 millimicrons to 100 millimicrons, a lacquer coating having a thickness in the range of 0.5 microns to 3 microns and a heat activatible adhesive. The metal layer lacquer coating and heat activatible adhesive are caused to be adhered to the substrate forming the final document during a stamping operation which releases said metal layer, lacquer coating and heat activatible adhesive from a plastic carrier film to which had initially been applied.

14 Claims, 4 Drawing Sheets

U.S. PATENT DOCUMENTS

| | | | |
|---|---|---|---|
| 5,155,604 | 10/1992 | Miekka et al. | 359/3 |
| 5,162,927 | 11/1992 | Moss et al. | 359/3 |
| 5,164,227 | 11/1992 | Miekka et al. | 427/162 |
| 5,172,250 | 12/1992 | Tsuchiya et al. | 359/1 |
| 5,189,531 | 2/1993 | Palmer et al. | 359/3 |
| 5,191,449 | 3/1993 | Newswanger | 359/22 |
| 5,194,971 | 3/1993 | Haines | 359/9 |
| 5,199,744 | 4/1993 | Shenton | 283/91 |
| 5,300,169 | 4/1994 | Tahara | 156/230 |

HOLOGRAPHIC DOCUMENT AND METHOD FOR FORMING

BACKGROUND ART

The use of holographic images, particularly on documents and credit cards for security purposes, has become extremely widespread. However, despite such widespread use, the use of holographic images is fairly expensive and generally involves the manufacture of a holographic image on a discrete chip in one operation and, in a separate operation, the adhering or laminating of such holographic chip to the intended document or article such as a stock certificate, check, or verification/identification card. U.S. Pat. No. 4,913,858, incorporated herein by reference, shows one prior art method of embossing holographic images or diffraction pattern images to a plastic film or to a plastic coating of a substrate, such as paper sheeting. It is believed that the present invention incorporates advantages not available in that or other prior art. Other patents which disclose various methods for forming holograms or diffraction grating images on substrates include U.S. Pat. Nos. 5,087,510; 4,773,718 and 4,728,377.

DISCLOSURE OF THE INVENTION

The present invention provides new and unique articles of manufacture and a method for forming a holographic image or diffraction pattern directly on the substrate forming a major component of the finished article whether it be a security document, check, verification/identification card or other document upon which it is desired to provide a hologram or diffraction grating image.

Accordingly, it is an object of the present invention to provide a method for forming directly upon the intended final document a hologram or diffraction grating image and to do so with high production efficiency and low cost.

It is a further object of the present invention to provide a composite sheet and method for forming such composite sheet which may be used in directly forming a hologram or diffraction grating image on the substrate of the intended finished document or article.

It is another object of the present invention to provide a document or other article on which a hologram has been directly formed thereon.

These and other objects of the present invention will become readily apparent from the following detailed description along with the appended drawings.

Another advantage of the present invention resides in the fact that the party producing the final document has the ability to retain and maintain control of its own embossing shim on which the hologram or diffraction pattern has been formed and which is used for embossing the hologram or diffraction pattern on the document. This is in contrast to a procedure which is commonly used at present in which a chip on which the hologram has been embossed is prepared by a hologram supplier who ships only the chip to the party planning to adhere it to the document. In this latter procedure, the hologram chip supplier retains the embossing shim thus depriving the party preparing the security document of control of this critical element of its security system and introducing additional expense for the auditing and secure transportation of said chips.

BEST MODE OF CARRYING OUT THE INVENTION

Figure 1:
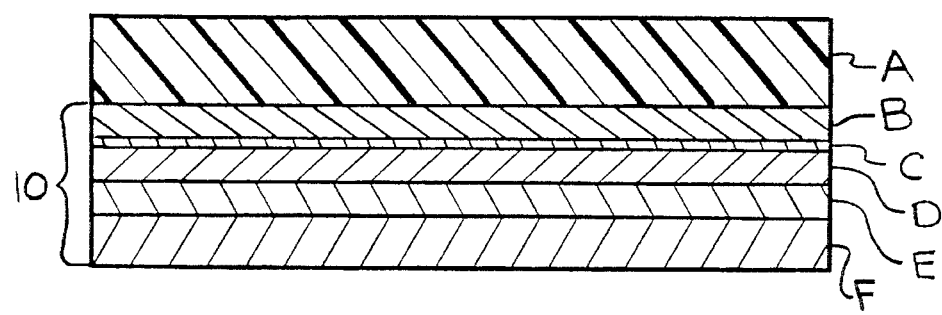
FIG. 1 is a schematic view showing a cross section of one embodiment of composite sheet affixed to a carrier film, which composite sheet may be used in applying the hologram or diffraction grating image directly to a substrate.

Referring now to FIG. 1, there is shown one construction of composite sheet which, for the purposes of this description will be referred to as "x-factor" sheet, which may be used for applying a hologram directly to a substrate. There is shown in FIG. 1 a composite sheet 10 affixed to a film substrate A. The film substrate A has a thickness in the range of 12 microns to 50 microns and may be formed of one of a number of different types of material including a film of polyester such as polyethyleneterephthalate or a film of biaxially oriented polypropylene, cellulose tri-acetate, polystyrene, polyethylene or polyvinylchloride. In the embodiment of FIG. 1, a release coating B of a wax such as a microcrystalline wax or a partially saponified montan wax or a siloxane having a thickness in the range of 0.025 microns to 1 micron is applied to the film substrate A. A very thin layer of metal C having a thickness in the range of 20 millimicrons to 100 millimicrons is applied to the release coating B by vacuum metal deposition or sputtering or electron beam deposition. The metal layer C is preferably aluminum; however, it could be stainless steel, nichrome, gold, silver, platinum or any other metal which can be vaporized and deposited by vacuum deposition or applied by sputtering or electron beam deposition.

A coating D of a lacquer such as acrylic, styrene acrylonitrile, polyethyleneterephthalate or nitrocellulose is applied to the metal layer in a thickness in the range of 0.5 microns to 3 microns. The coating D is preferably a thermosoftening lacquer applied from solution and containing acrylic and/or nitrocellulose and/or chlorinated rubber.

A tie coating E is then applied to the lacquer coating D. The tie coating E is a material which is preferably the same type of material used for the lacquer coating D but a much thinner layer. The tie coating E has a thickness in the range of 0.05 microns to 0.2 microns. It has been discovered that the use of a tie coating such as the tie coating E increases the bond between the lacquer coating D and the adhesive coating F.

The final coating for the "x-factor" composite sheet 10 is a heat activated adhesive coating F which is formulated for its ability to adhere to the particular substrate to be used in the final document. Such final document could be a stock certificate, check or verification/identification card. Such substrate, for example, might be plain or printed paper, coated paper, a sophisticated security paper, or a plastic such as polyethyleneterephthalate, polyvinylchloride, oriented polypropylene, acetate or the like. Heat activated adhesives are well known and can be readily obtained for use in adhering to any of the above types of substrates. For example, depending on the substrate, the heat activated adhesive coating F could be a mixture of vinyl acetate, vinyl alcohol copolymer and other heat softening resins dissolved in a mixture of ethanol and water, if intended for graphics use. The thickness of the heat activated adhesive coating may be in the range of 0.75 microns to 4 microns.

The purpose of the tie coating E is to increase the bond between the lacquer coating D and the adhesive coating F. However, as will be apparent for the various modifications to be disclosed herein, the tie coating E may be omitted.

Figure 2:
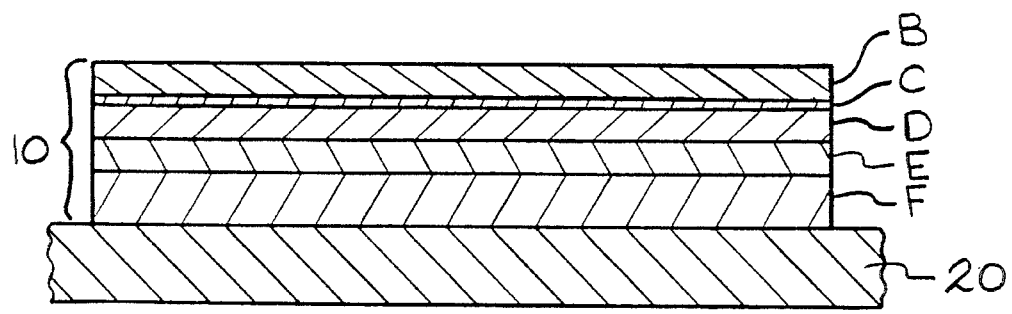
FIG. 2 is a view similar to FIG. 1 but showing the composite sheet removed from the carrier film and adhered to the substrate of the intended finished document or other article.

FIG. 2 shows schematically the construction following the next step of the method. In FIG. 2 there is shown the composite sheet 10 removed from the film substrate A and adhered to a document substrate 20, with the heat activated adhesive coating F facing and adhered to such document substrate 20. Removal of the film substrate A leaves the composite sheet 10 with the release coating B exposed. The document substrate 20 may be of any desired material to which the heat activated adhesive may adhere including but not limited to paper, printed or security paper, coated paper or a wide variety of plastic film or sheet such as those used for the film substrate A. For example, if the desired final document is a security document such as a stock certificate, the document substrate 20 will be printed security paper. If the final intended document is a verification/identification card, the document substrate will usually be a plastic material.

Figure 3:
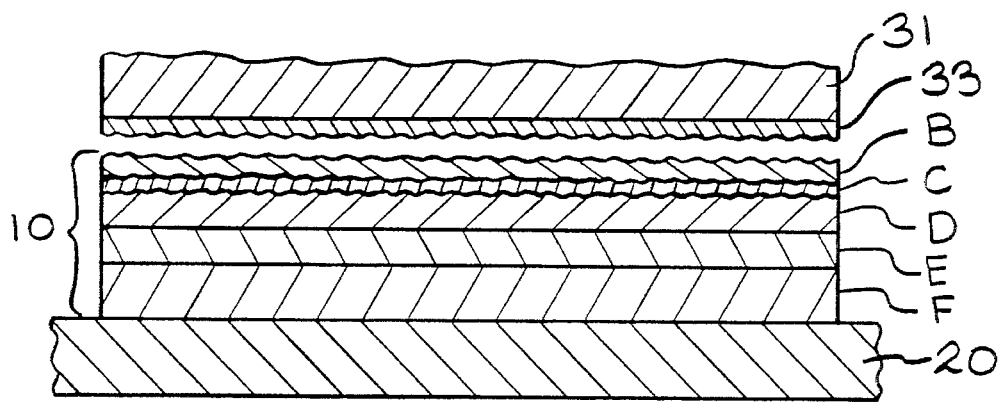
FIG. 3 is a schematic view showing a cross section of the finished article with the hologram or diffraction grating image embossed in the surface opposite the substrate.

Referring to FIG. 3, the composite sheet 10 adhered to the document substrate 20 forming the primary portion of the final document has had embossed into the release coating B, metal layer C and lacquer coating D the holographic image or diffraction pattern which has been embossed therein by a die or stamping head 31 carrying an embossing shim 33.

Figure 4:
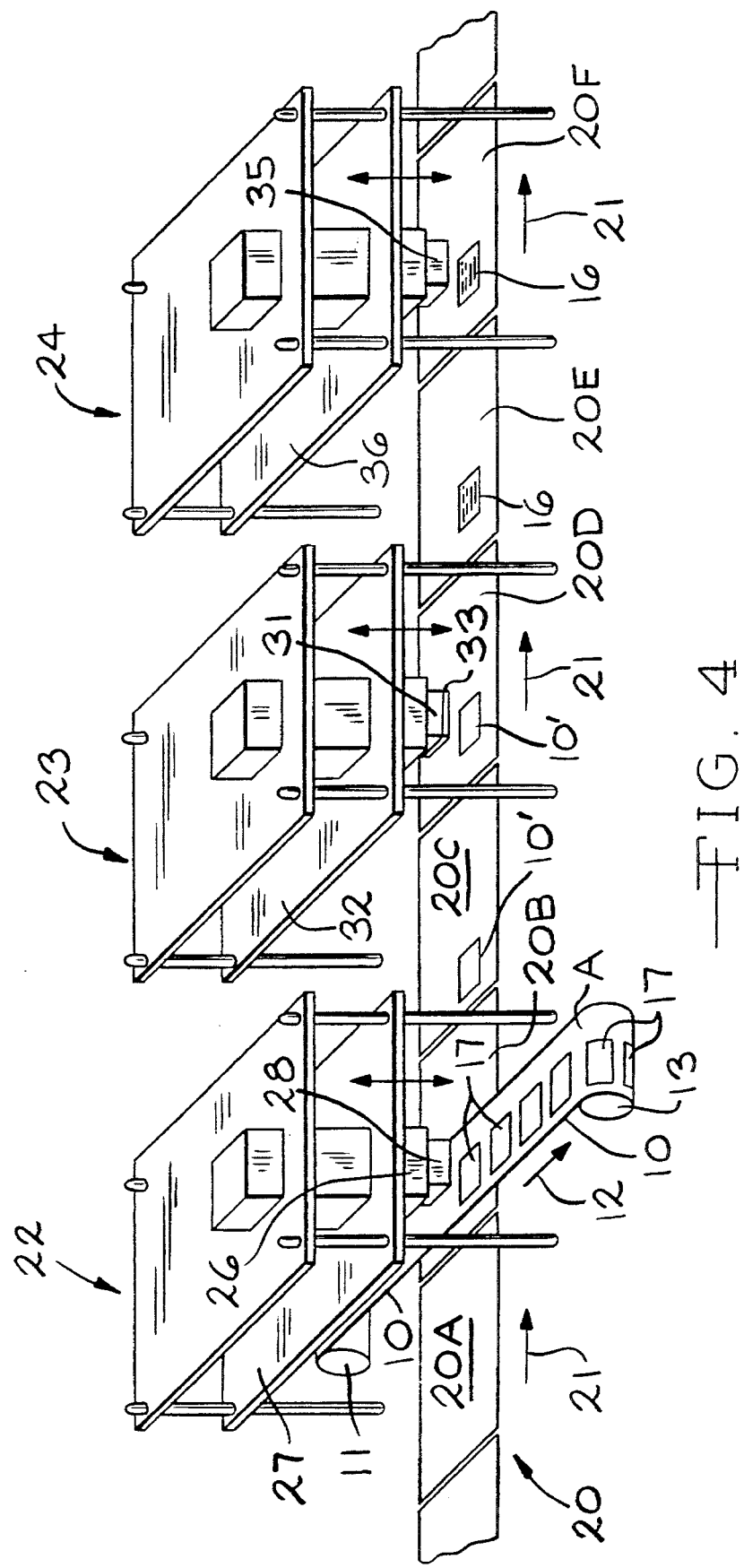
FIG. 4 is a schematic view showing one type of apparatus for forming a hologram or diffraction grating image directly upon the composite sheet of FIG. 1 or a chip portion thereof adhered to a substrate forming the main portion of the final document.
Figure 6:
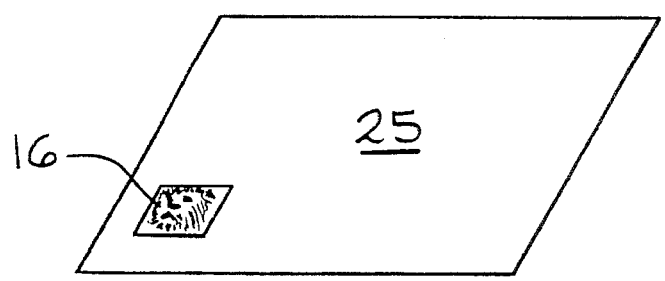
FIG. 6 is a perspective view of a finished document manufactured according to the present invention.

Referring now to FIG. 4, there is shown schematically one apparatus and process for successively hot stamping small areas of the composite sheet 10 to the document substrate 20 thereby leaving a small portion of composite sheet 10 which may be characterized as a chip 10' having an area the size of the stamping head adhered to the document substrate 20 and thereafter embossing the holographic image or diffraction grating image on the chip 10' and into the release coating B, metal layer C and lacquer coating D to form the final document. As shown, the substrate 20 is a continuous strip containing a series of discrete, interconnected sections 20A, 20B, 20C, 20D, 20E and 20F, etc., and is fed along a horizontal path from a supply roll (not shown) to a take-off station (not shown). The sections 20A, 20B, 20C, 20D, 20E, and 20F, etc., may have printing and constitute the major portions of finished documents with a holographic image or diffraction grating image to be embossed thereon. For example, there is shown in FIG. 6 a document 25 having a security holographic image 16 to prevent counterfeiting, such as stock certificates or checks for example, or any other desired document upon which it is desired to have embossed a diffraction grating image or a hologram.

The document substrate 20 could, therefore, be formed of various types and qualities of paper, including papers coated with a wide variety of plastics or other materials, security paper or a film of plastic such as polyethyleneterephthalate, polyvinylchloride, oriented polypropylene, polyethylene, acetate or the like. Assuming the document substrate 20 is for use in the manufacture of security documents, the interconnected sections 20A, 20B, 20C, 20D, 20E, and 20F, etc., will preferably be fed with the primary printing information facing upward if it is desired to have the security hologram affixed to the primary viewing surface; however, it could obviously be reversed if it was desired to have the security hologram affixed to the reversed side. The continuous strip of document substrate 20 is fed in the generally horizontal path in a first direction denoted by the arrows 21 beneath a stamping station 22 and, thereafter, beneath an embossing station 23. If desired, it may also be fed through a protective overlay station 24.

The composite sheet 10 with the "x-factor" construction, while affixed to the film substrate A is fed from a supply roll 11 beneath the stamping station 22, over the document substrate 20 and in closely adjacent relationship thereto. The combination composite sheet 10 and film substrate A is fed in a second direction indicated by the arrow 12 at substantially 90° angle to the first direction 21. The composite sheet 10 is positioned with the heat activated layer F contacting the document substrate 20 and the film substrate A facing up or away from the document substrate 20. The film substrate A and the portions of the layers B, C, D, E and F of the composite sheet 10 not transferred to the document substrate 20 are taken up by a take-up roll 13.

The stamping station 22 is provided with a hot stamping head 26 carrying a die 28 and, directly thereunder a flat support plate (not shown). The hot stamping head 26 and die 28 are maintained at a temperature in the range of 75° C. to 250° C. and are mounted on a platform 27 for movement between a raised position shown in FIG. 4 and a lowered position. When the platform 27 is in a lowered position, the die 28 engages the film substrate A, heating it and the composite sheet 10 to a temperature in the range of 75° C. to 250° C. and urging the composite sheet 10 against the underlying section of substrate 20 and against the support plate. In FIG. 4, the underlying section is 20B. Immediately prior to engagement of the die 28 to the against the film substrate A, the composite sheet 10 with the film substrate A and the continuous strip of document substrate 20 are caused to briefly stop, with movement resuming when the head 26 and die 28 are raised.

As a result of the heat and pressure to which the film substrate A and composite sheet 10 and the successive sections of document substrate 20 are subjected by clamping between the die 28 and the support plate, the heat activated adhesive layer F is caused to become adhered to the specific section of the document substrate so engaged, section 20B, as shown in FIG. 4. At the same time, the heat causes the release coating B of the composite sheet 10 to separate from the film substrate A with the result that the section 20B has affixed thereto a chip 10' portion of the composite sheet 10 constituting the release coating B, the metal layer C, the lacquer coating D, the tie coating E and the heat activated adhesive F in a size corresponding to the size of the hot stamping head 26. The die 28 is flat in order to provide substantially uniform heat and pressure to the underlying portion of the composite sheet 10 and section 20B during the stamping operation and thus ensure uniform adhesion of the adhesive layer F to the section 20B and uniform release of the release coating B from the film substrate A. The hot stamping head 26 and die 28 should be maintained at a temperature in the range of 75° C. to 250° C. in order to bring the contacted portion of the composite sheet 10 to such temperature range. As may be seen in FIG. 4, those portions of the film substrate A and composite sheet 10 which were subjected to heat and pressure by the die 28 appear as a series of windows 17 containing only the film substrate A while the remaining portions being taken up by the take-up roll 13 consist of the film substrate A and all layers of the original composite sheet 10, namely, B, C, D, E and F.

After leaving the stamping station 22, the sections 20B, 20C, 20D, etc., are moved to the embossing station 23 carrying with them the stamped chips 10' of the composite sheet 10 consisting of layers B, C, D, E and F with the layer F being the heat activated adhesive which is now adhered to the face of the sections 20C and 20D as shown in FIG. 4.

The embossing station 23 includes a heated stamping head 31 mounted on a platform 32 moveable between a raised position shown in FIG. 4 to a lowered position at which the heated stamping head 31 contacts the section 20D. The heated stamping head 31 carries an embossing shim 33 bearing the diffraction grating image or, in the case of security documents, preferably, a holographic image. When the section 20D is positioned beneath the heated stamping head 31 in a position in which the stamped chip 10' of such section 20D is aligned to be contacted by the heated stamping head 31 and embossing shim 33, the platform 32 will be lowered to cause the embossing shim 33 carried by the heated stamping head 31 to engage the stamped chip 10' which was adhered to the section 20D at the stamping station 22. A support plate (not shown) is positioned beneath the heated stamping head 31. Upon lowering of the platform 32, the stamped chip 10' of the section 20D is compressed between the embossing shim 33 secured to the heated stamping head 31 and the flat support plate thereby embossing the holographic pattern or diffraction grating image carried by such embossing shim 33 into the upper surface of the chip 10'. The heated stamping head 31 and the embossing shim 33 are maintained at a temperature in the range of 75° C. to 250° C. The image carried by the embossing shim 33 will be embossed into the release coating B and the metal layer C and to some extent into the lacquer coating D forming holographic image 16 or diffraction grating image. The platform 32 is then raised and the continuous strip with the sections 20A, 20B, 20C, 20D, etc., moved with the completed holographic image 16 on section 20D to a position indicated by section 20E. The section 20E with the holographic image 16 or diffraction grating image embossed therein may then be cut from the continuous strip thus forming the final document 25 as shown in FIG. 6.

However, in many instances it is desirable to provide a protective coating layer to the holographic image 16 for increased abrasion resistance. In this case the section 20E as well as the other sections 20F, etc., remain uncut from the continuous strip and are moved into a protective overlay station 24. As shown in FIG. 4, section 20F is positioned at the protective overlay station 24 with its holographic image 16 positioned beneath a head 35 carrying overlay lacquer suitable for providing an abrasion resistant coating to the holographic image 16. The head 35 is mounted on a platform 36 moveable between a raised position shown in FIG. 4 to a lowered position in which the head 35 may engage and apply the protective coating layer to the holographic image 16. Preferably, a back up plate (not shown) is positioned beneath the head 35. Following application of the protective coating layer, the section may be cut from the continuous strip thus forming the final document 25 shown in FIG. 6.

Figure 7:
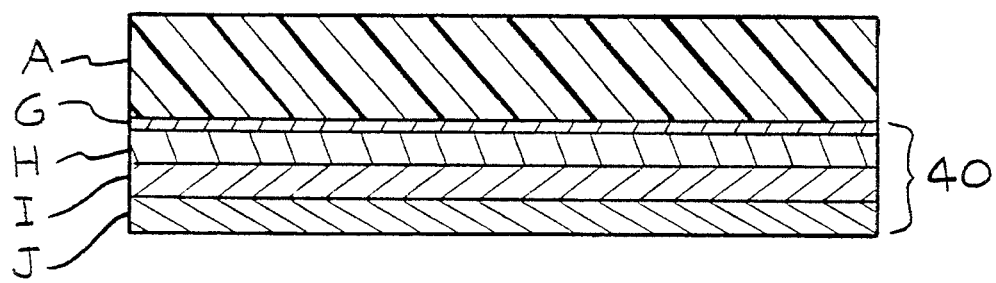
FIG. 7 is a schematic view showing a cross section of a second embodiment of composite sheet affixed to a carrier film, which composite sheet may be used in applying the hologram or diffraction grating image directly to a substrate.

Referring now to FIG. 7, there is shown a further embodiment in which there is provided a film substrate A and a composite sheet 40 having a slightly modified construction from that of the first embodiment of composite sheet 10. The construction of the composite sheet 40 is similar to that of the composite sheet 10 with the exception that there is no release coating between the film substrate to be released following application to the document and the metal layer. Thus, the composite sheet 40 consists of a layer G of metal, a coating H of lacquer, a tie coating I and a layer J of heat activated adhesive. The metal layer G is a very thin layer of metal having a thickness in the range of 20 millimicrons to 100 millimicrons. The metal layer G may be applied by vacuum metal deposition, sputtering, or electron beam deposition and is preferably aluminum; however, it could be stainless steel, nichrome, gold, silver, platinum or any other metal which can be vaporized and deposited by vacuum deposition or applied by sputtering or electron beam deposition. It has been discovered that although a release coating such as that utilized in the embodiment of FIG. 1 may be used, its presence is not absolutely necessary and, in fact, there may be some benefits in not utilizing such a release coating. It has been found that there is a natural tendency for the metal layer G to be rejected from the plastic film substrate A with the result that it along with the other layers of the composite sheet 40 of the embodiment of FIG. 7 may be readily separated from the film substrate A following the stamping operation at the stamping station 22. The remaining layers of the embodiment of FIG. 7 are identical to the final three layers of the embodiment of FIG. 1 with the coating H of lacquer being a member of the group of acrylic, styrene acrylonitrile, polyethyleneterephthalate or nitrocellulose applied to the metal layer G in a thickness in the range of 0.5 microns to 3 microns. Preferably, the lacquer is a thermosoftening lacquer applied from solution and containing acrylic and/or nitrocellulose and/or chlorinated rubber or ultraviolet cured resin.

The tie coating I applied to the lacquer coating H is similar to the tie coating E of the embodiment of FIG. 1.

The layer J of heat activated adhesive is applied to the tie coating I and, as in the previous embodiment, the heat activated adhesive is one which may vary depending upon the specific type of substrate to be used for the document substrate 20 to which the chips 10' are to be applied and the holographic image or diffraction grating image is to be embossed.

Figure 8:
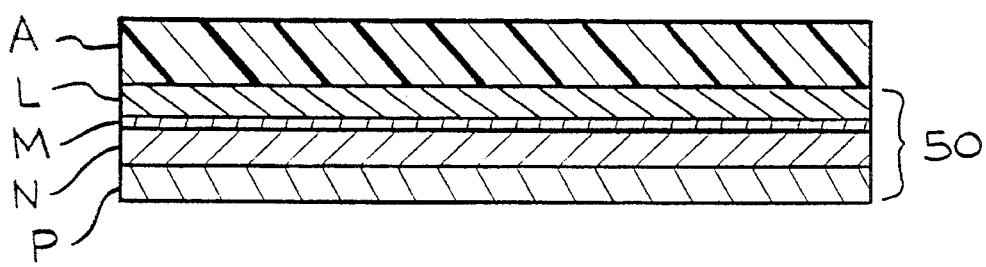
FIG. 8 is a view similar to FIG. 7 showing yet another embodiment of composite sheet affixed to a carrier film.

Referring now to FIG. 8, there is shown another embodiment having a slightly different construction of composite sheet 50 affixed to the film substrate A. This embodiment is similar to the embodiment of FIG. 1 with the exception that there is no tie coating between the lacquer coating and the heat activated adhesive. Thus, in the embodiment of FIG. 8, there is provided a film substrate A to which the composite sheet 50 is affixed.

The composite sheet 50 includes a release coating L of a wax or siloxane having a thickness in the range of 0.025 microns to 1 micron applied to the film substrate A. The wax is preferably a microcrystalline wax or a partially saponified montan wax. A very thin layer M of metal having a thickness in the range of 20 millimicrons to 100 millimicrons is applied to the release coating L in the manner previous described.

A coating N of lacquer of the type previously described is applied to the metal layer M in a thickness in the range of 0.5 microns to 3 microns.

Applied directly to the lacquer coating N is a heat activated adhesive coating P which, as in the previous embodiments, will vary depending upon the type of substrate to be used in the final document.

Figure 9:
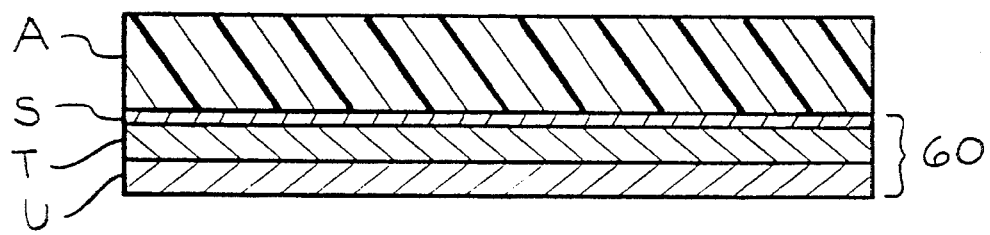
FIG. 9 is a view similar to FIG. 7 showing still another embodiment of composite sheet affixed to a carrier film.

Referring now to FIG. 9, there is shown another embodiment of composite sheet 60 affixed to a film substrate A. According to this embodiment, there is neither a release coating nor a tie coating. Thus, in the embodiment of FIG. 9, the composite sheet 60 comprises a metal layer S which is applied directly to such film substrate A. The metal layer S is the same as that utilized for the metal layer B in the embodiment of FIG. 1. A lacquer coating T such as that previously described is applied to the metal layer S in a thickness in the range of 0.5 to 3 microns. Applied directly to the lacquer coating T is a heat activated adhesive coating U which is similar to the coating F of the embodiment of FIG. I and will vary depending upon the type of material used for the final document.

A significant advantage of the embodiments of FIGS. 7 and 9 resides in the fact that the embossed hologram or diffraction grating image contained on the embossing shim 33 will be embossed directly onto the metal layer G in the case of the embodiment of FIG. 7 or the metal layer S in the case of the embodiment of FIG. 9. The embossed hologram or diffraction grating image will extend into the lacquer coating H of the embodiment of FIG. 7, the lacquer coating N of the embodiment of FIG. 8 and the lacquer coating T of the embodiment of FIG. 9.

Figure 5:
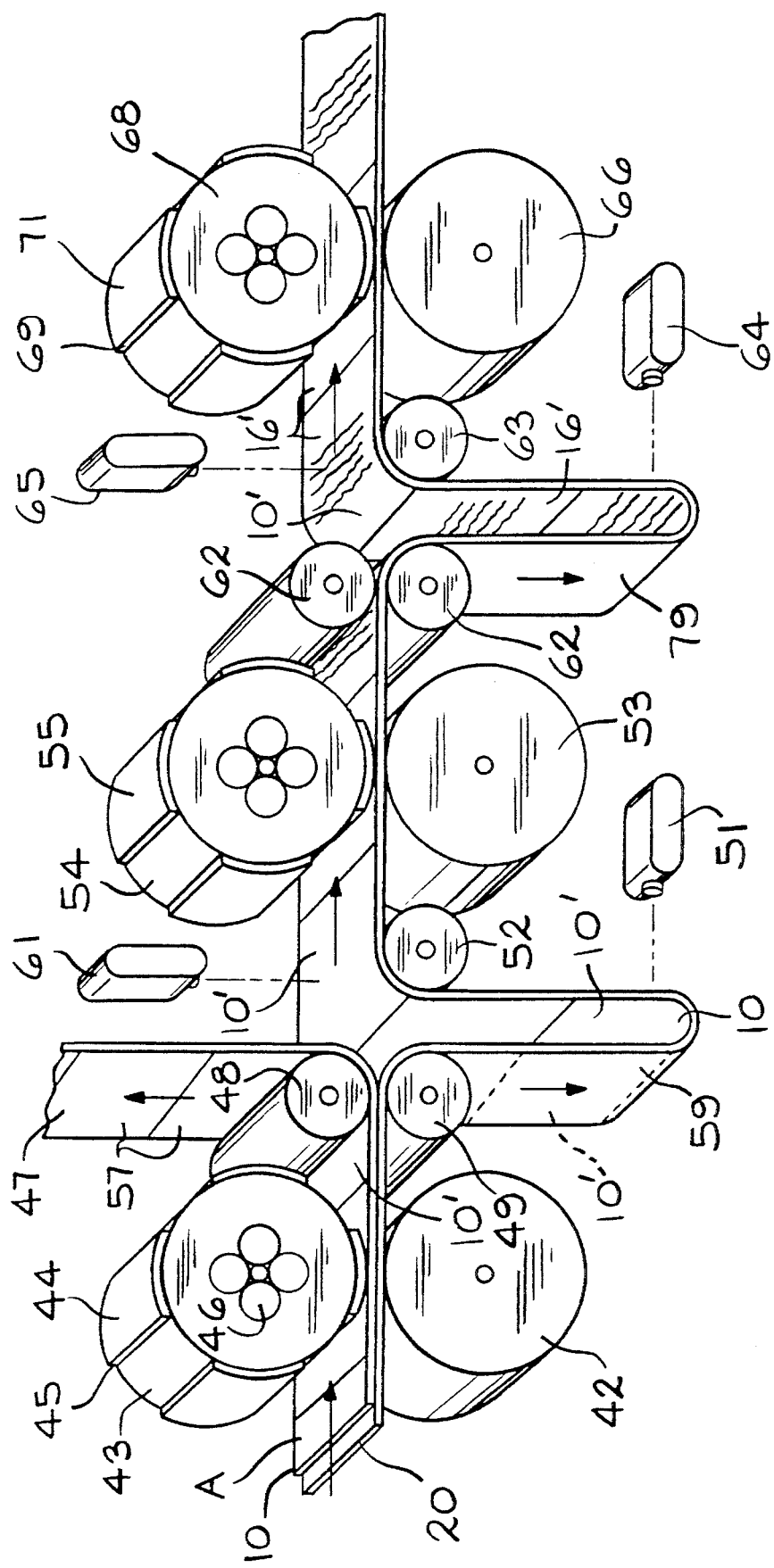
FIG. 5 is a schematic view showing another type of apparatus for directly applying a hologram or diffraction grating image to a substrate.

Referring now to FIG. 5, there is shown a modified apparatus for applying a chip 10' of the composite sheet 10 to the document substrate and embossing directly therein the holographic image or diffraction grating pattern to form the final document on a continuous basis. As shown in FIG. 5 the document substrate 20 and the film substrate A with the affixed composite sheet 10 are fed in surface to surface engagement between a nip roller 42 and a heated metal roller 43 having aluminum or other type of metal dies 45 which are intermittently spaced around the circumference of the metal roller 43 and which may, if desired, have a silicon rubber 44 thereon. The adhesive layer F of the composite sheet 10 is facing and in contact with the document substrate 20. The nip roller 42 may be metal or a metal with a silicon rubber coating and is maintained at ambient temperature. The metal roller 43 is heated as by internal cartridge heaters 46. The internal cartridge heaters may reach a temperature up to 400° C. and heat the aluminum dies 45 such that the temperature of the surface of the silicon rubber 44 is maintained at a temperature between 75° C. and 250° C.

As the combination film substrate A and composite sheet 10 and the document substrate 20 are fed together between the nip roller 42 and the metal roller 43, those portions of the composite sheet 10 which are subjected to heat and pressure between the aluminum dies 45 with their silicon rubber 44 and the nip roller 42 are caused to be released from the film substrate A such that a chip 10' consisting of the release coating B and the remaining layers C, D, E and F is adhered to the document substrate 20. A chip 10' is stamped to the document substrate 20 by each of the aluminum dies 45 with their silicon rubber thus forming a series of intermittent stamped chips 10'. That portion of the film substrate A and those portions of the composite sheet 10 not contacted by the aluminum dies 45 are removed as a continuous strip of waste material 47 by being separated from the document substrate 20 after passing through a pair of drive shafts 48 and 49.

Those portions of the film substrate A and composite sheet 10 which were contacted by the aluminum dies 45 appear on the strip of waste material 47 as a series of windows 57 containing only the film substrate A.

The document substrate 20 with intermittent chips 10' adhered thereto under heat and pressure by the aluminum dies 45 with the silicon rubber 44 is moved around the lower driveshaft 49 downwardly to form a loop 59 the length of which is controlled by an optical sensor 51. It is then fed over a vacuum advance roller 52 so that it moves in a horizontal direction between a nip roller 53 and an embossing roller 54 having spaced apart embossing shims 55 on which have been formed the holographic image or the diffraction grating image. The vacuum advance roller 52 pushes the document substrate 20 with the chips 10' adhered thereto between the rollers 53 and 54. An optical sensor 61 is provided to provide appropriate registration such that the stamped chips 10' which are now on the upper surface of the document substrate 20 are registered to be engaged by the embossing shims 55. The embossing shims 55 will engage the release coating layer B and thus emboss therein and in the metal layer C and the lacquer coating layer D the holographic image 16' or diffraction grating image carried by the embossing shim 55. At this point, the final document could be trimmed from the web. However, if it is desired to provide a protective overlay over the hologram, the web with the intermittent chips 10' stamped with the holographic image 16' may be passed between a pair of free wheeling rollers 62 and directed downwardly forming a loop 79, with the length of the loop 79 being determined by an optical sensor 64. The document substrate 20 with the holographic images 16' is then passed over a vacuum advance roller 63 along a horizontal plane beneath another optical sensor 65 which registers the chips 10' including the holographic images 16' with the coating die. The document substrate 20 is pushed by the vacuum advance roller 63 between a nip roller 66 of metal or metal with a silicon rubber coating and maintained at ambient temperature and a heated roller 68 having aluminum dies 69 carrying a head 71 for applying the protective layer to the chips 10' bearing the holographic images 16'. Following application of the protective layer, the sections may be cut to the appropriate length thereby forming the final document similar to the one shown in FIG. 6.

Although FIGS. 4 and 5 have been described in applying the composite sheet 10 of the embodiment of FIGS. 1–3, it is clear that the apparatus and method described with respect to FIGS. 4 and 5 can be used with the embodiments of FIGS. 7–9 using composite sheets 40, 50 and 60.

The present invention provides an effective and efficient method and article for forming documents and other goods with holographic images.

Many modifications will become readily apparent to those skilled in the art. Accordingly, the scope of the present invention should be determined only by the scope of the appended claims.

I claim:

1. A method for forming a composite sheet adapted to apply a holographic image directly to a substrate comprising the steps of:

(a) providing a film of material selected from the group consisting of a polyester, biaxially oriented polypropylene, cellulosic triacetate, polystyrene, polyethylene and polyvinylchloride;

(b) depositing on said film a layer of metal having a thickness in the range of 20 millimicrons to 100 millimicrons;

(c) applying to said metal layer a first lacquer coating having a thickness in the range of 0.5 microns to 3 microns, said first lacquer coating being a member selected from the group consisting of acrylic, styrene-acrylonitrile polymer, polyester and nitrocellulose;

(d) applying to said first lacquer coating a second lacquer coating having a thickness in the range of 0.05 microns to 0.2 microns, said second lacquer coating being a member selected from the group consisting of acrylic, styrene-acrylonitrile polymer, polyester and nitrocellulose; and (e) applying to said second lacquer coating a heat activatible adhesive having a thickness in the range of 0.75 microns to 4 microns.

2. A method for forming a composite sheet adapted to apply a holographic image directly to a substrate comprising the steps of:

(a) providing a film of material being a member selected from the group consisting of a polyester, biaxially oriented polypropylene, cellulosic triacetate, polystyrene, polyethylene and polyvinylchloride;

(b) depositing on said film a release coating, said release coating being a member selected from the group consisting of wax and siloxane;

(c) depositing on said film a layer of metal having a thickness in the range of 20 millimicrons to 100 millimicrons;

(d) applying to said metal layer a first lacquer coating having a thickness in the range of 0.5 microns to 3 microns, said first lacquer coating being a member selected from the group consisting of acrylic, styrene-acrylonitrile polymer, polyester and nitrocellulose;

(e) applying to said first lacquer coating a second lacquer coating having a thickness in the range of 0.05 microns to 0.2 microns, said second lacquer coating being a member selected from the group consisting of acrylic, styrene-acrylonitrile polymer, polyester and nitrocellulose; and (f) applying to said second lacquer coating a heat activatible adhesive having a thickness in the range of 0.75 to 4 microns.

3. A method for forming a composite sheet adapted to apply a holographic image directly to a substrate comprising the steps of:

(a) providing a film of material selected from the group consisting of a polyester, biaxially oriented polypropylene, cellulosic triacetate, polystyrene, polyethylene and polyvinylchloride;

(b) depositing on said film a layer of metal having a thickness in the range of 20 millimicrons to 100 millimicrons;

(c) applying to said metal layer a lacquer coating having a thickness in the range of 0.5 microns to 3 microns, said lacquer coating being a member selected from the group consisting of acrylic, styrene-acrylonitrile polymer, polyester and nitrocellulose;

(d) applying to said lacquer coating a heat activatible adhesive having a thickness in the range of 0.75 microns to 4 microns.

4. A method for forming a composite sheet adapted to apply a holographic image directly to a substrate comprising the steps of:

(a) providing a film of material selected from the group consisting of a polyester, biaxially oriented polypropylene, cellulosic triacetate, polystyrene, polyethylene and polyvinylchloride;

(b) depositing on said film a release coating, said release coating being a member selected from the group consisting of wax and siloxane;

(c) depositing on said film a layer of metal having a thickness in the range of 20 millimicrons to 100 millimicrons;

(d) applying to said metal layer a lacquer coating having a thickness in the range of 0.5 microns to 3 microns, said lacquer coating being a member selected from the group consisting of acrylic, styrene-acrylonitrile polymer, polyester and nitrocellulose;

(e) applying to said lacquer coating a heat activatible adhesive having a thickness in the range of 0.75 microns to 4 microns.

5. An article of manufacture comprising:

(a) a plastic film substrate wherein said substrate is selected from the group consisting of a polyester, a biaxially oriented polypropylene, cellulosic triacetate, polystyrene, polyethylene and polyvinylchloride; and (b) a composite sheet engaged to said substrate and releasable therefrom upon application of heat and pressure, said composite sheet including:

(i) a layer of metal having a thickness in the range of 20 millimicrons to 100 millimicrons facing said substrate, (ii) a lacquer coating having a thickness in the range of 0.5 micron to 3 microns engaged to said layer of metal, said lacquer coating being a member selected from the group consisting of acrylic, styrene-acrylonitrile polymer, polyester and nitrocellulose, and (iii) a heat activatible adhesive having a thickness in the range of 0.75 micron to 4 microns; said composite sheet adapted to receive a holographic image or diffraction grating pattern in said layer of metal following release of said composite sheet from said substrate.

6. The article of claim 5, wherein said layer of metal is aluminum.

7. The article of claim 6 further including a release coating of a wax or siloxane between said layer of metal and said substrate.

8. The article of claim 7, wherein said release coating has a thickness in the range of 0.025 micron to 1 micron.

9. The article of claim 8, wherein said release coating is microcrystalline wax or a partially saponified montan wax.

10. The article of claim 6 further including a tie coating between said lacquer coating and said heat activatible adhesive, said tie coating having a thickness in the range of 0.05 micron to 0.2 micron and being a member selected from the group consisting of acrylic, styrene-acrylonitrile polymer, polyester and nitrocellulose.

11. The article of claim 10 further including a release coating of a wax or siloxane between said layer of metal and said substrate.

12. The article of claim 11, wherein said release coating has a thickness in the range of 0.025 micron to 1 micron.

13. The article of claim 12, wherein said release coating is microcrystalline wax or a partially saponified montan wax.

14. An article of manufacture comprising:

(a) a plastic film substrate wherein said substrate is selected from the group consisting of a polyester, a biaxially oriented polypropylene, cellulosic triacetate, polystyrene, polyethylene and polyvinylchloride; and (b) a composite sheet engaged to said substrate and releasable therefrom upon application of heat and pressure, said composite sheet including:
(i) a release coating of a wax or siloxane between said layer of metal and said substrate having a thickness in the range of 0.025 micron to 1 micron,
(ii) a layer of aluminum having a thickness in the range of 20 millimicrons to 100 millimicrons facing said substrate,
(iii) a lacquer coating having a thickness in the range of 0.5 micron to 3 microns engaged to said layer of metal, said lacquer coating being a member selected from the group consisting of acrylic, styrene-acrylonitrile polymer, polyester and nitrocellulose,
(iv) a tie coating having a thickness in the range of 0.05 micron to 0.2 micron and being a member selected from the group consisting of acrylic, styrene-acrylonitrile polymer, polyester and nitrocellulose, and
(v) a heat activatible adhesive having a thickness in the range of 0.75 micron to 4 microns;

said composite sheet adapted to receive a holographic image or diffraction grating pattern in said layer of metal following release of said composite sheet from said substrate.

* * * * *